United States Patent
Rice et al.

(10) Patent No.: US 11,626,154 B2
(45) Date of Patent: Apr. 11, 2023

(54) QUARTER MATCH CONCURRENT COMPENSATION IN A MEMORY SYSTEM

(71) Applicant: MICRON TECHNOLOGY, INC., Boise, ID (US)

(72) Inventors: Jacob Rice, Boise, ID (US); Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/350,325

(22) Filed: Jun. 17, 2021

(65) Prior Publication Data

US 2022/0406359 A1    Dec. 22, 2022

(51) Int. Cl.

| G11C 29/00 | (2006.01) |
|---|---|
| G11C 11/4076 | (2006.01) |
| G11C 11/408 | (2006.01) |
| G11C 29/50 | (2006.01) |
| G11C 29/44 | (2006.01) |

(52) U.S. Cl.
CPC ...... *G11C 11/4076* (2013.01); *G11C 11/4085* (2013.01); *G11C 11/4087* (2013.01); *G11C 29/44* (2013.01); *G11C 29/4401* (2013.01); *G11C 29/50* (2013.01); *G11C 29/781* (2013.01); *G11C 29/802* (2013.01)

(58) Field of Classification Search
CPC ............ G11C 11/4076; G11C 11/4085; G11C 11/4087
See application file for complete search history.

(56) References Cited

U.S. PATENT DOCUMENTS

| 9,349,491 | B1 | 5/2016 | Morgan et al. |
|---|---|---|---|
| 10,204,679 | B2 | 2/2019 | Cernea |
| 2002/0012282 | A1 | 1/2002 | Saito et al. |
| 2009/0201752 | A1* | 8/2009 | Riho ............... G11C 8/10 365/225.7 |
| 2021/0043269 | A1* | 2/2021 | He ................ G11C 29/802 |
| 2021/0200625 | A1* | 7/2021 | Park .............. G06F 11/0727 |
| 2021/0375348 | A1* | 12/2021 | Lee ............... G11C 11/4087 |
| 2021/0398600 | A1 | 12/2021 | Jang et al. |
| 2022/0139489 | A1 | 5/2022 | Rehmeyer et al. |

OTHER PUBLICATIONS

U.S. Appl. No. 17/350,305 titled "Concurrent Compensation in a Memory System" filed Jun. 17, 2021.

* cited by examiner

*Primary Examiner* — Mushfique Siddique
(74) *Attorney, Agent, or Firm* — Dorsey & Whitney LLP (57) ABSTRACT

An example apparatus may perform concurrent threshold voltage compensation in a memory array with distributed row redundancy. The example apparatus may include a row decoder configured to configured to, in response to a determination that the prime row address matches a defective prime row address, concurrently initiate a threshold voltage compensation operation on both of a prime row of the respective plurality of prime rows of memory cells of a first row section of the plurality of row sections corresponding to the prime row address and the respective redundant row of a second row section of the plurality of row sections. The row decoder may be further configured to stop an access operation associated with the prime row from proceeding based on a comparison of subset of match signals from either the first or second pluralities of row sections.

21 Claims, 8 Drawing Sheets

QUARTER MATCH CONCURRENT COMPENSATION IN A MEMORY SYSTEM

BACKGROUND OF THE INVENTION

High data reliability, high speed of memory access, and reduced chip size are features that are demanded from semiconductor memory. In recent years, there has been an effort to further increase the clock speed of memories without sacrificing reliability, which, for a fixed number of clock cycles, effectively reduces an absolute time period available to perform a memory operation. One area that can act as an impediment to faster clock speeds is the time it takes to charge and discharge access lines during a memory access operation. As clock speeds increase, charging and discharging of access lines may consume an increasingly larger share of allotted time to perform some memory access operations. One time period of a memory access operation that helps define a total latency within a memory to provide data from a memory cell at an output is a minimum row address (RAS) to column address (CAS) delay, or tRCD. The tRCD is a minimum number of clock cycles required between activating a row of memory and accessing a memory cell in a column of the memory cells coupled to the activated row. Reducing the tRCD may provide more margin for a memory device.

DETAILED DESCRIPTION

This disclosure describes examples of a system to perform quarter-match concurrent compensation in a memory system with distributed row redundancy. In a semiconductor memory, a memory array may be divided into banks, with each bank further divided into row sections each having a common number of rows. Some semiconductor device memories may include redundant or repair rows of memory cells within the memory array that can repair defective memory along the rows. The repair may be accomplished by remapping a memory address for a primary memory location in the block of memory to a redundant memory unit, thus repairing a defective primary memory location. In some examples, the redundant rows may be distributed across the array such that some or all of the row sections have at least one repair row. In some examples, the repair row or rows in each section may be used to replace a defective row in any row section within the bank.

When a memory access (e.g., read or write) command is received, a memory may initiate a memory access operation to respond to the command. For a read operation, the memory access operation may include a chain of events (e.g., a row address (RAS) chain) to prepare the memory to retrieve the requested data from the prime or target location within the memory array, and provide the requested data to a data terminal for transmission over a data bus. One time period of a memory access operation that helps define a total latency within a memory to provide data from a memory cell at an output is a minimum RAS to column address (CAS) delay, or tRCD. The tRCD is a minimum number of clock cycles required between activating a row of memory and accessing a memory cell in a column of the memory cells coupled to the activated row.

In some examples, part of the RAS chain may performing threshold voltage compensation in sense amplifiers used to sense data stored in the memory cell. Sense amplifiers that include threshold voltage compensation circuitry may compensate for threshold voltage differences between components of the sense amplifier. Compensating for threshold voltage differences between circuit components of the sense amplifiers may improve reliability. However, a process for compensating for the threshold voltage differences may increase the tRCD, as adding a compensation phase to a sense operation may increase a total time to complete the sense operation.

When an ACT command (e.g., initiating a read operation) is received, the memory may decode the corresponding prime or target row address received with the ACT command and may determine whether the prime row has been replaced with a redundant row. If so, the memory may re-direct the ACT command access to the row address associated with the redundant row (e.g., redundant row address). To determine whether the prime row has been replaced with a redundant row, the memory may include a repair row logic tree (e.g., RXNOM) that includes logic circuitry configured to compare repair row addresses stored in fuse latches for each row section. The process of determining row redundancy may delay the ACT access operation.

To mitigate the row redundancy delay, the memory may initiate the access operation for the prime row, including the VtC compensation operation, while row redundancy is being determined In addition, in response to an initial detection of a redundant row address (e.g., a hit or match with the prime row address), but before the RXNOM tree has fully adjudicated the redundancy comparisons, the memory may also initiate an access operation, including the VtC compensation operation, for the redundant row concurrent with the VtC compensation for the prime row. If a hit is detected, the output of the RXNOM logic tree may cause the sense operation at the prime row to be halted in favor of the redundant row.

However, latency of signals progressing through the RXNOM logic tree may still add a delay before sense operations can proceed. Thus, to further reduce tRCD, a quarter-match RXNOM (e.g., an RXNOMFast) signal may be used to halt the prime row sense operation (e.g., reset the row factor signals) earlier than the full RXNOM signal. This may allow activation of the wordline to commence earlier than waiting for the full RXNOM signal to complete.

If no hit is detected, then no redundancy access operation is initiated, and the prime row sense operation continues. By concurrently initiating the VtC compensation in both a prime and redundant row for a replaced row and halting the prime row when a hit is detected while the redundancy is still being fully resolved, the memory may reduce tRCD for an access operation as compared to waiting to activate a wordline until after the redundancy determination is complete. In addition, skipping the concurrent VtC compensation when no redundancy row is detected may reduce power consumption as compared with always performing concurrent VtC compensation.

Figure 1:
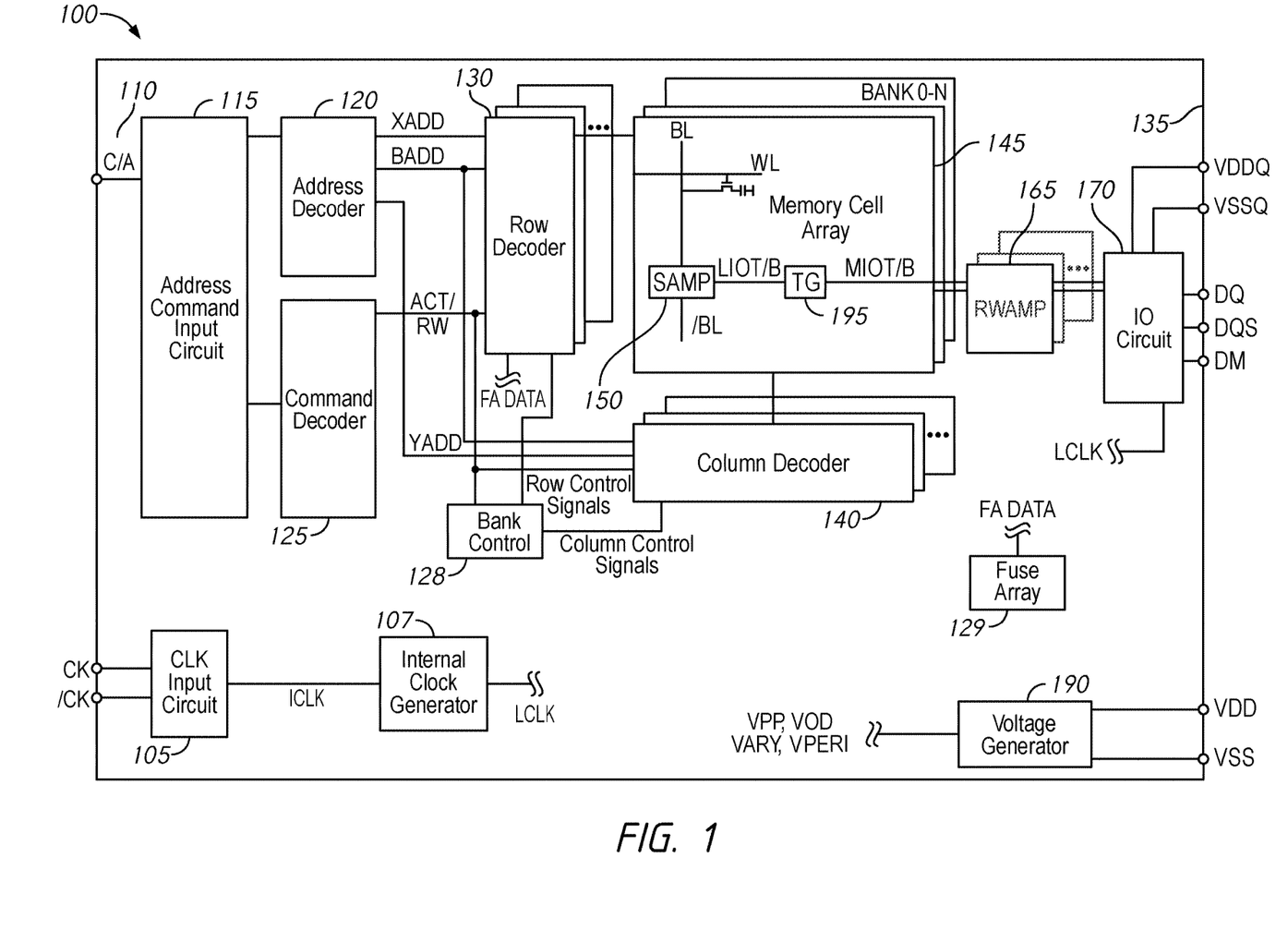
FIG. 1 is a schematic block diagram of a semiconductor device memory system, in accordance with an embodiment of the present disclosure.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, a control circuit 121, a plurality of row decoders 130, a memory cell array 145 including sense amplifiers 150 and transfer gates 195, a plurality of column decoders 140, a plurality of bank control circuits 128, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and/CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes), which may be selected by the column select CS signal from the column decoders 140. In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. In some examples, the plurality of sense amplifiers 150 may include threshold voltage compensation circuitry that compensates for threshold voltage differences between components of the sense amplifier.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals for provision to the row decoders 130, the column decoders 140, and the bank control circuits 128. The bank control circuits 128 may provide row control signals and column control signals to the row decoders 130 and the column decoders 140, respectively, to control timing of operations of the RAS chain. The signals from the bank control circuits 128 may include a row command signal to select a word line, a column command signal, such as a read command or a write command, to select a bit line, etc.

Normally, when a read command is issued and a row address and a column address are timely supplied with the activation and read commands (ACT/RW), read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the ACT and write commands R/W, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

In some examples, a BANK0-N of the memory cell array 145 may be divided into row sections, with each row section having a common number of primary rows. In addition, the memory cell array 145 may further include redundant or repair rows of memory cells distributed across each row section of the memory cell array 145, which can be used to repair defective primary rows. The repair is accomplished by remapping a memory address for a primary row to a redundant memory unit. In some examples, the redundant rows may be distributed across the memory cell array 145 such that some or all of the row sections have at least one repair row. In some examples, the redundant row or rows in each row section may be used to replace a defective row in another row section.

Thus, as explained above, when a memory access (e.g., read or write) command is received, the semiconductor device may initiate a memory access operation to respond to the command. For a read operation, the memory access operation may include a chain of events (e.g., a row address (RAS) chain) to prepare the semiconductor device 100 to retrieve the requested data from the prime or target location within the memory cell array 145, and provide the requested data to a data terminal DQ for transmission over a data bus. One time period of a memory access operation that helps define a total latency within a memory to provide data from a memory cell at an output is a minimum RAS to column address (CAS) delay, or tRCD. The tRCD is a minimum number of clock cycles required between activating a row of memory and accessing a memory cell in a column of the memory cells coupled to the activated row.

When a read command is received, the command decoder 125 may provide an ACT command to the row decoder 130, the column decoder 140, and to the bank control circuits 128. In response, the bank control circuits 128 may provide row control signals and column control signals to the row decoder 130 and the column decoder, respectively. The row decoder 130 may include a plurality of predecoder circuits that are configured to decode a received prime row address XADD to determine which wordline to activate. Each of the plurality of pre-decoders may be associated with a subset of row sections of a memory bank BANK0-N.

In addition, the row decoder 130 may include fuse latches that are configured to store defective row addresses received from a fuse array 129. In some examples, the fuse array 129 may provide fuse array data including the defective row addresses to the fuse latches of the row decoder 130 as part of a power-up or restart/reset sequence. A set of fuse latches may be allocated for each replacement row. The row decoder 130 may include a row redundancy comparison logic tree (e.g., RXNOM tree) that is configured to compare the corresponding prime or target row address received with the read command to determine whether the prime row has been replaced with a redundant row. If so, the RXNOM tree may cause respective ones of a plurality of predecoders to re-direct the read command access to the row address associated with the redundant row (e.g., redundant row address). The process of determining row redundancy may delay the read access operation.

Thus, to mitigate the row redundancy delay, a corresponding prime row predecoder of the plurality of predecoders may initiate the access operation for the prime row, including the VtC compensation operation, while row redundancy is being determined In addition, in response to an initial detection of a redundant row address (e.g., a hit or match with the prime row address), but before the RXNOM tree has fully adjudicated the redundancy comparisons, a corresponding prime row predecoder of the plurality of predecoders may also initiate an access operation for the redundant row, including the VtC compensation operation, concurrent with the access operation for the prime row. If a hit is detected, the output of the RXNOM logic tree may cause the access operation by the prime row predecoder to be halted in favor of the redundant row predecoder. In some examples, the sense operation may be halted before the wordline for the prime row wordline is activated.

However, latency of signals progressing through the RXNOM logic tree may still add a delay before sense operations can proceed. Thus, to further reduce tRCD, a quarter-match RXNOM (e.g., an RXNOMFast) signal may be used to halt the prime row sense operation (e.g., reset the row factor signals) earlier than the full RXNOM signal. This may allow activation of the wordline to commence earlier than waiting for the full RXNOM signal to complete.

If no hit is detected, then no activation operation may be initiated for a redundancy row, and the prime row predecoder access operation may continue. By concurrently initiating the VtC compensation in both a prime and redundant row for a replaced row and halting the prime row when a hit is detected while the redundancy is still being fully resolved, the memory may reduce tRCD for an access operation as compared to waiting to activate a wordline until after the redundancy determination is complete. In addition, skipping the concurrent VtC compensation when no redundancy row is detected may reduce power consumption as compared with always performing concurrent VtC compensation.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
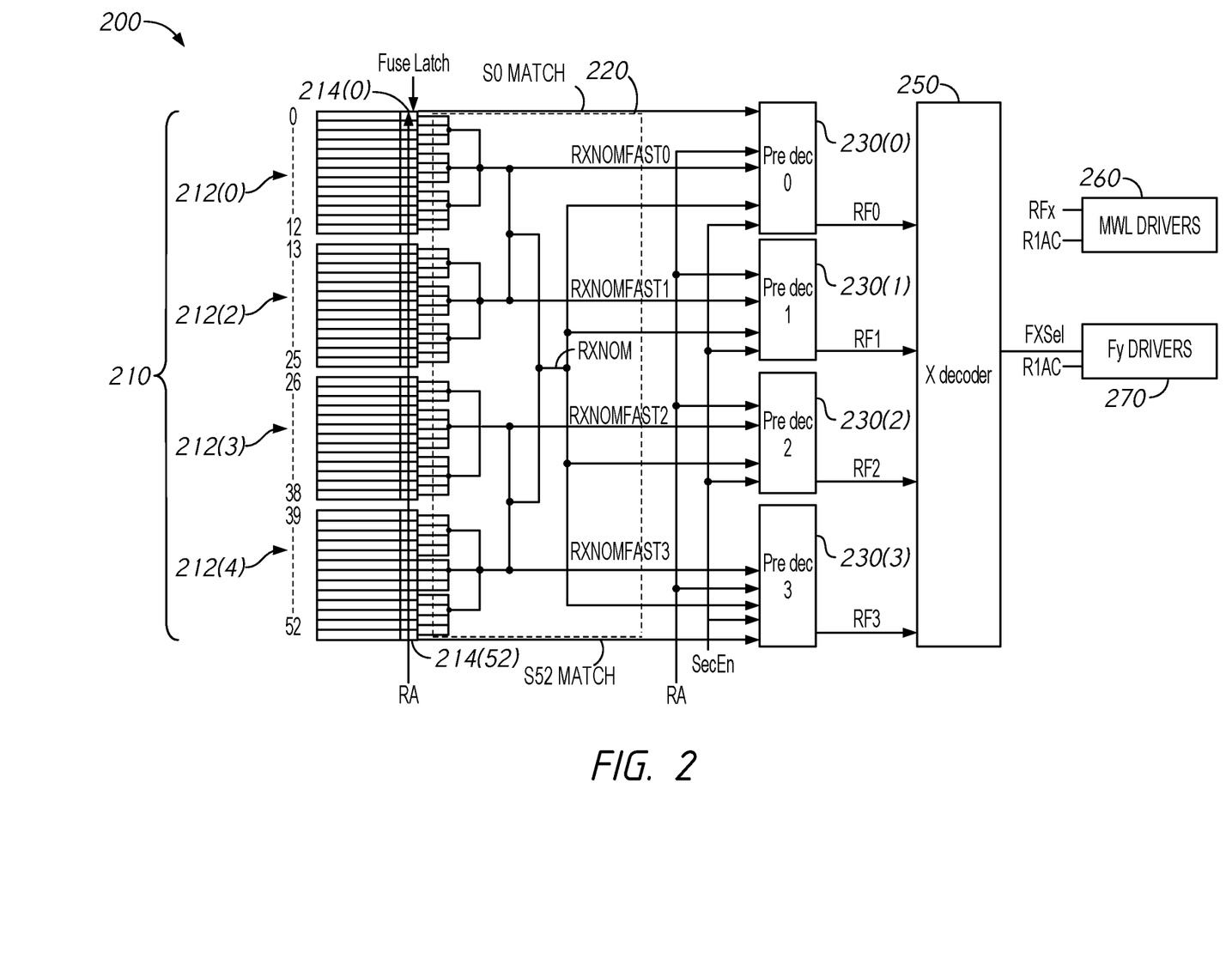
FIG. 2 is a block diagram of a semiconductor device, in accordance with an embodiment of the present disclosure.

FIG. 2 is a block diagram of a semiconductor device 200, in accordance with an embodiment of the present disclosure. The semiconductor device 200 may include a memory array mat 210 having row sections 0-52 divided into predecoder row section groups 212(0)-(4), and a row decoder (e.g., including fuse latches and comparators 214(0)-(52), a RXNOM tree 220, predecoders 230(0)-(3), and an x-decoder 250). The row decoder may be coupled to a main wordline drivers 260 and a FX drivers 270. In some examples, the row decoders 130 of FIG. 1 may implement the row decoder of FIG. 2.

The memory array mat 210 may include 53 rows sections of memory cells, with each row section including a plurality of prime rows of memory cells. In addition, some or all of the 53 row sections may include at least one redundant row of memory cells used to repair a defective row of memory cells in any of the 53 row sections. Each respective one or more of the redundant rows of the 53 row sections may be associated with a respective one of the fuse latches and comparators 214(0)-(52). The fuse latches and comparators 214(0)-(52) may be configured to store a respective defective row address when a redundant row in that section has been allocated to replace the defective row of memory cells associated with the defective row address, as well as to compare a received row address RA to determine whether target or prime row matches the defective row. When a match is detected by a respective one of the fuse latches and comparators 214(0)-(52), a S0-S52 match signal may be provided. FIG. 2 only depicts the S0 and S52 match signals for clarity, but it is appreciated that each of the fuse latches and comparators 214(0)-(52) may provide a respective one of the S0-S52 match signals.

Respective subsets of the 53 row sections may be grouped together in the predecoder row section groups 212(0)-(4). For example, each of the predecoder row section groups 212(0)-(4) may include a respective 13 or 14 rows of the memory array mat 210. Each of the predecoder row section groups 212(0)-(4) may be coupled to a respective one of the predecoders 230(0)-(3) to provide the S0-S52 match signals. For example, the predecoder row section group 212(0) may be coupled to the predecoder 230(0), the predecoder row section group 212(1) may be coupled to the predecoder 230(1), etc. While four of the predecoder row section groups 212(0)-(3) and four of the predecoders 230(0)-(3) are depicted in FIG. 2, it is appreciated that more or fewer than four of each may be present in the memory array mat 210 and the row decoder.

In addition, each of the predecoder row section groups 212(0)-(4) may be coupled to the RXNOM tree 220 to provide the S0-S52 match signals. The RXNOM tree 220 may include logic to compare all of the S0-S52 match signals to provide a RXNOM signal to the predecoders 230(0)-(3). The RXNOM signal may indicate whether there is a hit or a miss with respect to a replacement row for the row address RA. In addition, the RXNOM tree 220 may be configured to provide a respective quarter-match signal RXNOMFast0-3 to the predecoders 230(0)-(3). Each of the RXNOMFast0-3 signals represent a partial comparison of the S0-S52 match signals. For example, the RXNOMFast0 signal may represent a comparison of the S0-S12 signals, the RXNOMFast1 signal may represent a comparison of the S13-S25 signals, the RXNOMFast2 signal may represent a comparison of the S26-S38 signals, and the RXNOMFast3 signal may represent a comparison of the S39-S52 signals.

Each of the predecoders 230(0)-(3) may receive the row address RA indicating the prime or target row for an access operation, a respective one of the RXNOMFast0-3 signals, the RXNOM signal, a respective subset of the S0-S52 match signals, and a section enable signal SecEn (e.g., received from a bank control circuit, such as the bank control circuits 128 of FIG. 1). The predecoders 230(0)-(3) may be configured to decode the received signals to set row factor signals. For example, in response to the SecEn signal, when a respective one (e.g., prime row predecoder) of the predecoders 230(0)-(3) detects that the prime row address RA is targeting one of the rows of memory cells in the assigned predecoder row section group 212(0)-(3), the prime row predecoders may set respective row factor RF0-3 signals to start an access operation, beginning with a VtC compensation operation, on the prime row of memory cells. In addition, in response to the SecEn signal, when a respective one (e.g., redundancy row predecoder) of the predecoders 230(0)-(3) receives a respective one of the S0-S52 match signals indicating a hit (e.g., prime row is defective and has been replaced with a redundant row in the row section corresponding to the S0-S52 match signal), the assigned redundancy row predecoder may set respective row factor RF0-3 signals to start an access operation, beginning with a VtC compensation operation, on the redundant row of memory cells. If none of the S0-S52 match signals indicate a hit, then no redundant row access operation may be initiated by the predecoders 230(0)-(3). When any of the S0-S52 signals indicate a hit, the hit signal may flow through the RXNOM tree 220 to provide a hit indication on a corresponding one of the RXNOMFast0-3 signals and on the RXNOM signal. In response to the corresponding one of the RXNOMFast0-3 signals indicating a hit, the respective predecoder 230(0)-(3) may cease the prime row access operation in favor of the access operation associated with the redundant row. In addition, when the RXNOM signal indicates a hit, the prime row predecoder may further cease the prime row access operation in favor of the access operation associated with the redundant row.

The x-decoder 250 may receive the row factor signals, and may provide the row factor signals and other control signals to the main wordline drivers 260 and the FX drivers 270. In response to an activation signal R1AC (e.g., received from a bank control circuit, such as the bank control circuits 128 of FIG. 1), the main wordline drivers 260 may be configured to activate a main wordline associated with the prime and/or redundant rows. The FX drivers 270 may be configured to provide control signals to an array section associated with the prime and/or redundant rows.

In operation, each of the fuse latches and comparators 214(0)-(52) may be allocated to one redundant row of memory cells that can be used to replace a defective prime row of memory cells. During an initialization sequence (e.g., as part of a power up or reset operation), a fuse array may provide fuse data to respective one or more of the fuse latches and comparators 214(0)-(52) to indicate an assigned replacement of a respective defective memory row. In response, one or more of the fuse latches and comparators 214(0)-(52) may latch the received defective prime row address.

When an ACT command targeting a prime row of the memory array mat 210 is received, the row address RA is provided to the fuse latches and comparators 214(0)-(52) and the predecoders 230(0)-(3). The predecoder circuits 230(0)-(3) may decode the prime row address RA, and in response to the SecEn signal, a respective one (prime row predecoder) of the predecoder circuits 230(0)-(3) associated with the prime row address RA to set respective RF0-3 signals to initiate an access operation, including VtC compensation.

In parallel with decoding of the prime row address RA by the predecoders 230(0)-(3), the fuse latches and comparators 214(0)-(52) may compare the prime row address RA with latched defective row addresses. When a match or hit is detected, the respective one of the fuse latches and comparators 214(0)-(52) may provide the respective S0-S52 match signal indicating a hit to the RXNOM tree 220 and to the associated one (redundant row predecoder) of the predecoders 230(0)-(3). In response to the respective S0-S52 match signal indicating a hit, the redundant row predecoder may set respective RF0-3 signals to initiate an access operation, including VtC compensation, for the redundant row.

Also response to the respective S0-S52 match signal indicating a hit, the RXNOM tree 220 may set one of the RXNOMFast0-3 signals and the RXNOM signal to indicate a hit. Because the RXNOM includes a logic tree, a hit indication on one of the S0-S52 match signals may arrive at the redundant row predecoder 230(0)-(3) prior receipt of the respective RXNOMFast0-3 signal indicating a hit and the RXNOM signal indicating the hit at the predecoders 230(0)-(3).

When the RXNOMFast0-3 signal indicating a hit is received at the prime row predecoder, the prime row predecoder may reset certain ones of the RF0-3 signals to stop the access operation on the prime row in favor of the access operation associated with the redundant row. In addition, when the RXNOM signal indicating a hit is received at the prime row predecoder, the prime row predecoder may reset other RF0-3 signals to stop the access operation on the prime row in favor of the access operation associated with the redundant row. However, because a hit indication on the RXNOMFast0-3 signals is received at the predecoders 230 (0)-(3) before the hit indication on the RXNOM signal, using the RXNOMFast0-3 signals to stop an access operation on the prime row may reduce tRCD as compared with relying on the RXNOM signal.

If no hit is detected by the fuse latches and comparators 214(0)-(52), then no redundant row access operation may be started by the predecoders 230(0)-(3), and the RXNOM will indicate a miss to allow the access operation associated with the prime row to proceed.

The x-decoder 250 may receive the RF0-3 signals, and may provide control signals to a respective one of the main wordline drivers 260 and a respective one of the FX drivers 270. In response to the control signals and the R1AC signal, the respective one of the main wordline drivers 260 and the respective one of the FX drivers 270 may be to perform the access operation. Because of the concurrent access operations taking place in hit cases, the R1AC signal may be delayed until the RXNOM tree 220 has fully adjudicated the S0-S52 signals to detect a hit in order to avoid activating two wordlines. By concurrently initiating the VtC compensation in both a prime and redundant row while the redundancy is being determined, the semiconductor device 200 may reduce tRCD for an access operation as compared to waiting to start the sense operation until after the redundancy determination is complete. In addition, skipping the concurrent VtC compensation when no redundancy row is detected may reduce power consumption as compared with always performing concurrent VtC compensation.

Figure 3:
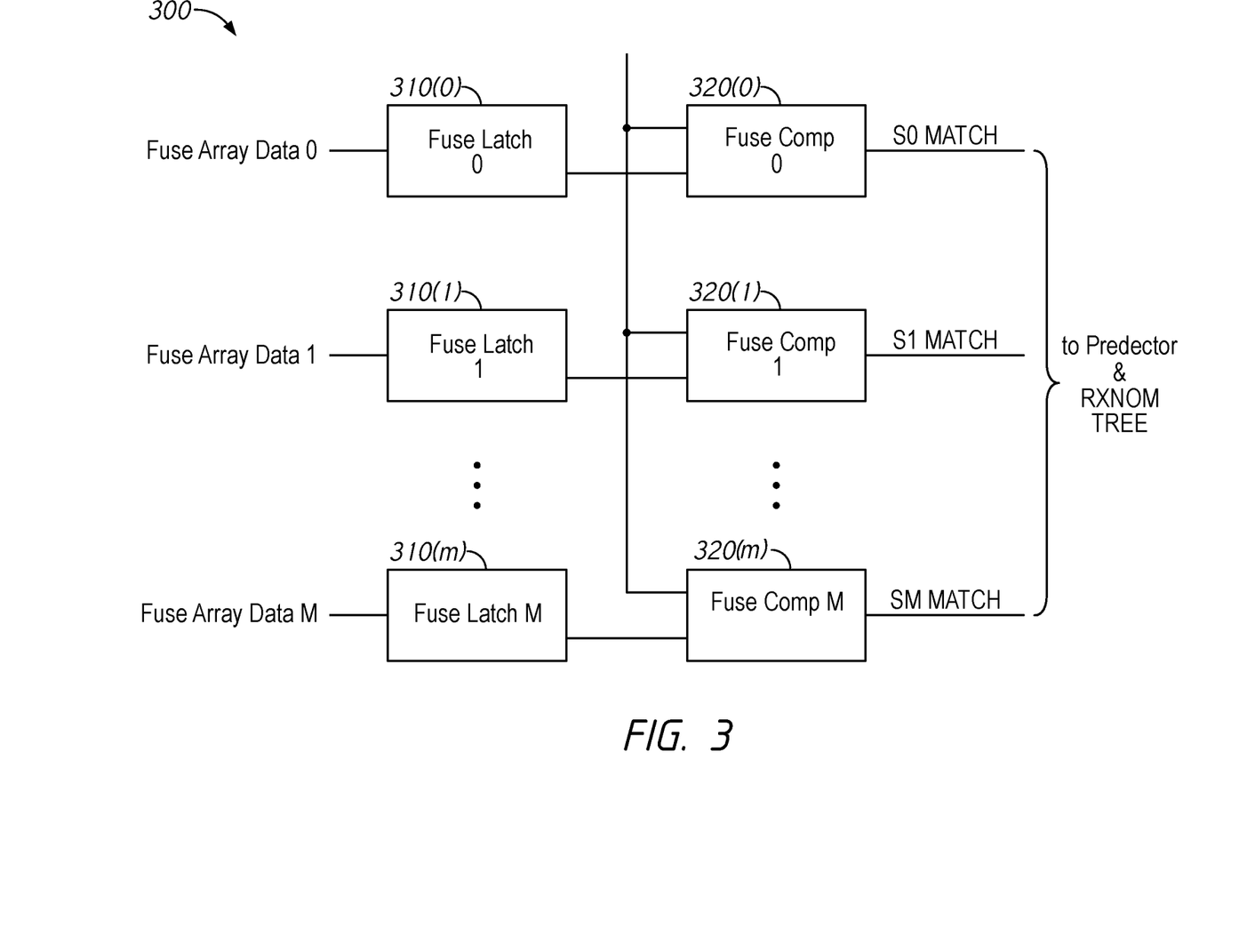
FIG. 3 is a block diagram of fuse latch circuits and match comparators between fuse addresses and row addresses, in accordance with an embodiment of the present disclosure.

FIG. 3 is a block diagram of fuse latch circuits and match comparators between fuse addresses and row addresses 300, in accordance with an embodiment of the present disclosure. The the fuse latch circuits and match comparators between fuse addresses and row addresses 300 may include fuse latches 1-m 310(0)-(m) each coupled to respective comparators 320(0)-(m). In some examples, the row decoders 130 of FIG. 1 and/or the fuse latches and comparators 214(0)-(52) of Figure two may implement the fuse latch circuits and match comparators between fuse addresses and row addresses 300.

Each of the fuse latches 1-m 310(0)-(m) may be configured to store a respective defective row address when a redundant row in a corresponding row section has been allocated to replace the defective row of memory cells associated with the defective row address. The defective row addresses may be provided from a fuse array via fuse array data 1-m signals during an initialization sequence (e.g., as part of a power up or reset operation). During an access operation, each of the fuse comparators 1-m 320(0)-(m) may compare a prime row address RA with a latched row address from the corresponding one of the fuse latches 310(0)-(m).

The fuse comparators 1-m 320(0)-(m) may provide a respective S0-Sm match signal based on the comparisons. For example, the fuse comparators 1-m 320(0)-(m) may provide the respective S0-Sm match signal having a first value when a match is detected (e.g., a hit) and may provide the respective S0-Sm match signal having a second value when no match is detected (e.g., a miss). In some examples, the S0-Sm match signals may be reset to indicate a miss between access operations. In some examples, the fuse comparators 1-m 320(0)-(m) may include bitwise XOR logic trees to perform the comparisons. The S0-Sm match signals may be provided to the RXNOM tree and respective predecoders.

Figure 4:
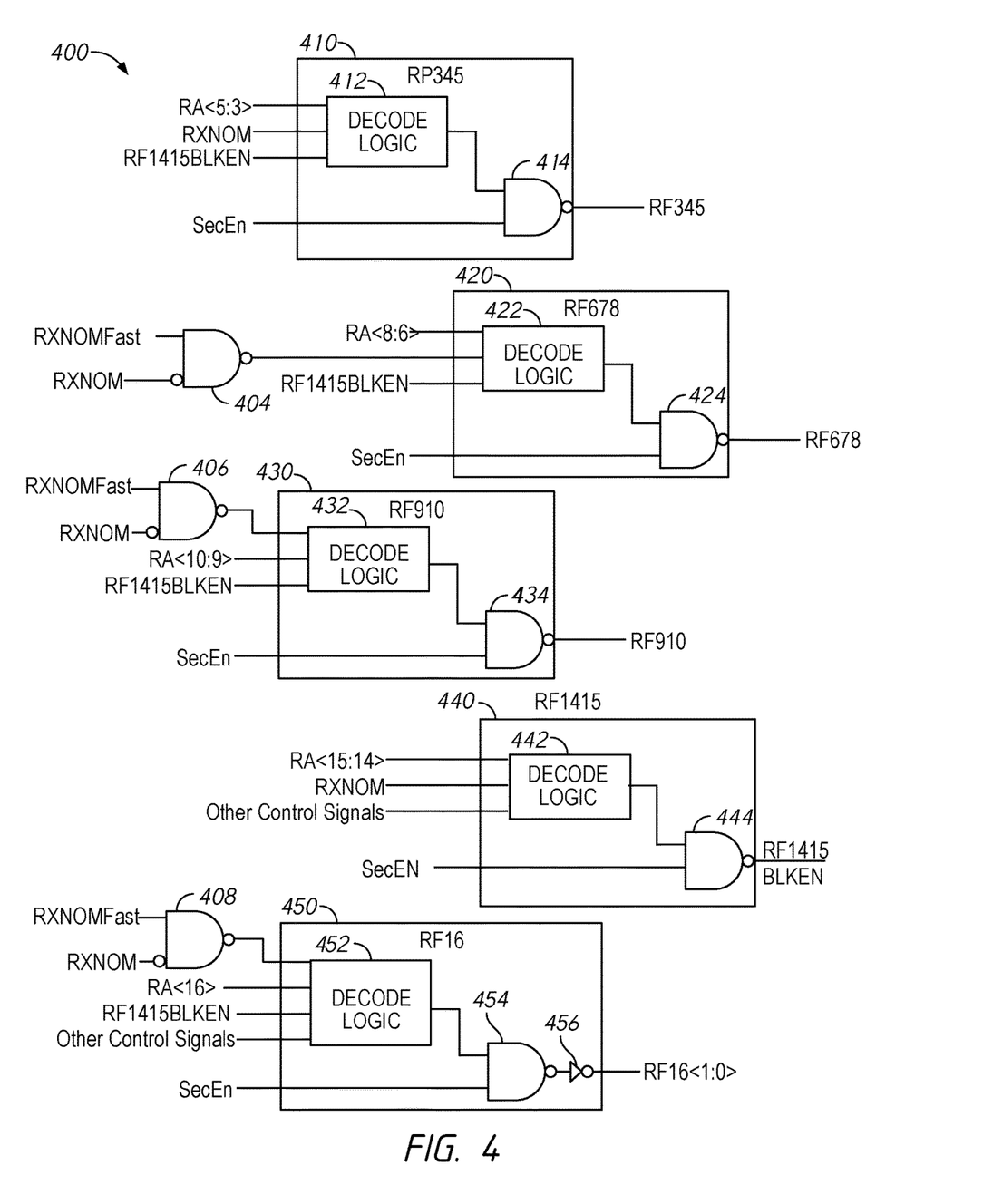
FIG. 4 is a block diagram of a portion of a predecoder circuit, in accordance with an embodiment of the present disclosure.

FIG. 4 is a block diagram of a portion of a predecoder circuit 400, in accordance with an embodiment of the present disclosure. The portion of the predecoder circuit 400 may include a RF345 decoder circuit 410, a RF678 decoder circuit 420, a RF910 decoder circuit 430, a RF1415 decoder circuit 440, and a RF16 decoder circuit 450. The portion of the predecoder circuit 400 may be configured to provide a subset of row factor (RF) signals. In some examples, the row decoders 130 of FIG. 1 and/or the predecoders 230(0-(3) may each implement the portion of the predecoder circuit 400.

The RF1415 decoder circuit 440 may include decode logic 442 that is configured to receive an RXNOM signal, row address RA<15:14> bits, and other control signals. In response to the RXNOM signal, the row address RA<15: 14> bits, and the other control signals, the decode logic 442 may provide a row factor block enable signal RF1415BLKEN to indicate target memory mat. In some examples, when a hit is indicated on the RXNOM signal (e.g., logical low value), the decode logic 442 may disable the RF1415BLKEN signal. The RF1415 decoder circuit 440 may further include a NAND gate 444 that is configured to control timing of release of the RF1415BLKEN signal to an output of the RF1415 decoder circuit 440 in response to the SecEn signal. The RF1415BLKEN signal may be used by the RF345 decoder circuit 410, the RF678 decoder circuit 420, the RF910 decoder circuit 430, and the RF16 decoder circuit 450.

The RF345 decoder circuit 410 may include decode logic 412 that is configured to receive the RXNOM signal, row address RA<5:3> bits, and the RF1415BLKEN signal. In response to the RXNOM signal, row address RA<5:3> bits, the RF1415BLKEN signal, the decode logic 412 may provide a row factor 345 signal RF345 to control a main wordline driver (e.g., the main wordline drivers 260 of FIG. 2). In some examples, when a hit is indicated on the RXNOM signal (e.g., logical low value), the decode logic 412 may disable the RF345 signal. The RF345 decoder circuit 410 may further include a NAND gate 414 that is configured to control release of the RF345 signal to an output of the RF345 decoder circuit 410 in response to the SecEn signal.

The RF678 decoder circuit 420 may include decode logic 422 that is configured to receive an output of a NAND gate 404, row address RA<8:6> bits, and the RF1415BLKEN signal. The NAND gate 404 may receive the inverted RXNOM signal and an RXNOMFast signal and may apply NAND logic to provide an output. In response to the output of the NAND gate 404, row address RA<8:6> bits, and the RF1415BLKEN signal, the decode logic 422 may provide a row factor 678 signal RF678 to control the main wordline driver (e.g., the main wordline drivers 260 of FIG. 2). In some examples, when a hit is indicated on the RXNOM signal (e.g., logical low value), the decode logic 422 may disable the RF678 signal. The RF678 decoder circuit 420 may further include a NAND gate 424 that is configured to control release of the RF678 signal to an output of the RF678 decoder circuit 420 in response to the SecEn signal.

The RF910 decoder circuit 430 may include decode logic 432 that is configured to receive an output of a NAND gate 406, row address RA<10:9> bits, and the RF1415BLKEN signal. The NAND gate 406 may receive the inverted RXNOM signal and the RXNOMFast signal and may apply NAND logic to provide an output. In response to the output of the NAND gate 406, row address RA<10:9> bits, and the RF1415BLKEN signal, the decode logic 432 may provide a row factor 910 signal RF910 to control the main wordline driver (e.g., the main wordline drivers 260 of FIG. 2). The RF910 decoder circuit 430 may further include a NAND gate 434 that is configured to control release of the RF910 signal to an output of the RF910 decoder circuit 430 in response to the SecEn signal.

The RF16 decoder circuit 450 may include decode logic 452 that is configured to receive an output of a NAND gate 408, row address RA<16> bit, the RF1415BLKEN signal, and other control signals. The NAND gate 408 may receive the inverted RXNOM signal and the RXNOMFast signal and may apply NAND logic to provide an output. In response to the output of the NAND gate 408, row address RA<16> bit, the RF1415BLKEN signal, and other control signals, the decode logic 442 may provide a row factor 16<1:0> signals RF16<1:0> to control the main wordline driver (e.g., the main wordline drivers 260 of FIG. 2). In some examples, when a hit is indicated on the RXNOM (e.g., logical low value) or RXNOMFast (e.g., logical high value) signals, the decode logic 452 may disable the RF16<1:0> signals. The RF16 decoder circuit 450 may further include a NAND gate 454 and inverter 456 that are configured to control release of the RF16<1:0> signals to an output of the RF16 decoder circuit 450 in response to the SecEn signal.

Figure 5:
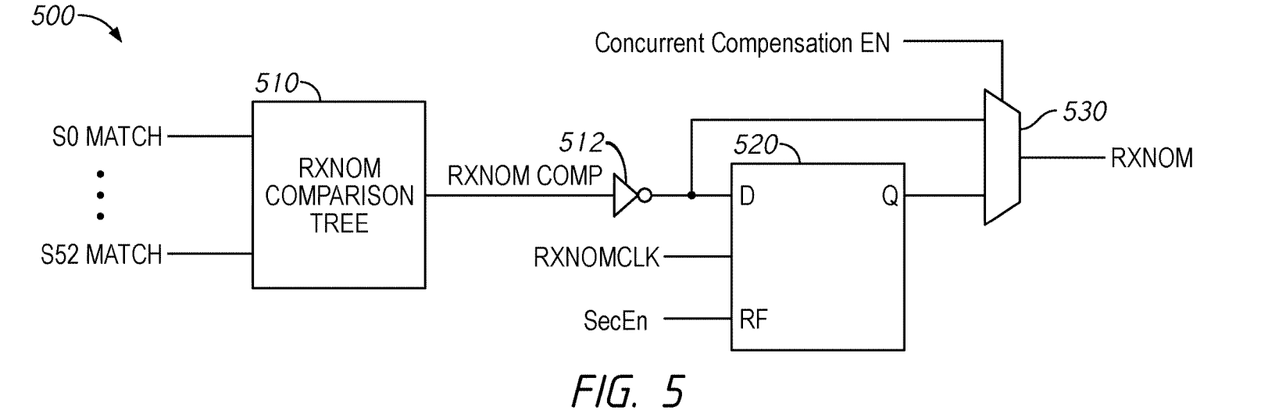
FIG. 5 is a block diagram of an RXNOM tree, in accordance with an embodiment of the present disclosure.

FIG. 5 is a block diagram of an RXNOM tree 500, in accordance with an embodiment of the present disclosure. The RXNOM tree 500 may include a RXNOM comparison tree 510, an inverter 512, a latch 520, and a multiplexer 530. The RXNOM tree 500 may be configured to provide the RXNOM signal. In some examples, the row decoders 130 of FIG. 1 and/or the RXNOM tree 220 may implement the RXNOM tree 500.

The RXNOM comparison tree 510 be configured to compare fuse latch comparison match signals S0-Sm match (e.g., the S0-52 match signals of FIG. 2 and/or the S0-Sm match signals of FIG. 3) to provide a RXNOM comparison signal. The RXNOM comparison signal may indicate whether any of the S0-Sm match signals indicate a hit for replacement of a defective prime row address. In some examples, the RXNOM comparison tree 510 may include a bitwise XOR logic tree to perform the comparisons. The inverted (e.g., via the inverter 512) RXNOM comparison signal may be provided to each of the latch 520 and the multiplexer 530. The latch 520 may be configured to latch the RXNOM comparison signal in response to an RXNOM clock signal (e.g., provided by bank control logic, such as the bank control circuits 128 of FIG. 1). The latch 520 may be configured to reset an output in response to the SecEn signal. The output of the latch 520 may be provided to the multiplexer 530.

The multiplexer 530 may be configured to provide one of the output of the inverter 512 or the output of the latch 520 as the RXNOM signal based on the concurrent compensation enable signal. For example, when concurrent compensation is disabled, the multiplexer 530 may provide output of the inverter 512 as the RXNOM signal. When concurrent compensation is enabled, the multiplexer 530 may provide the output of the latch 520 as the RXNOM signal. Because the output of the latch 520 is reset when a new access operation is started via the SecEn signal, the residual output of the RXNOM comparison tree 510 from the last access operation may be masked to avoid disruption of a next access operation when concurrent compensation is enabled.

Figure 6:
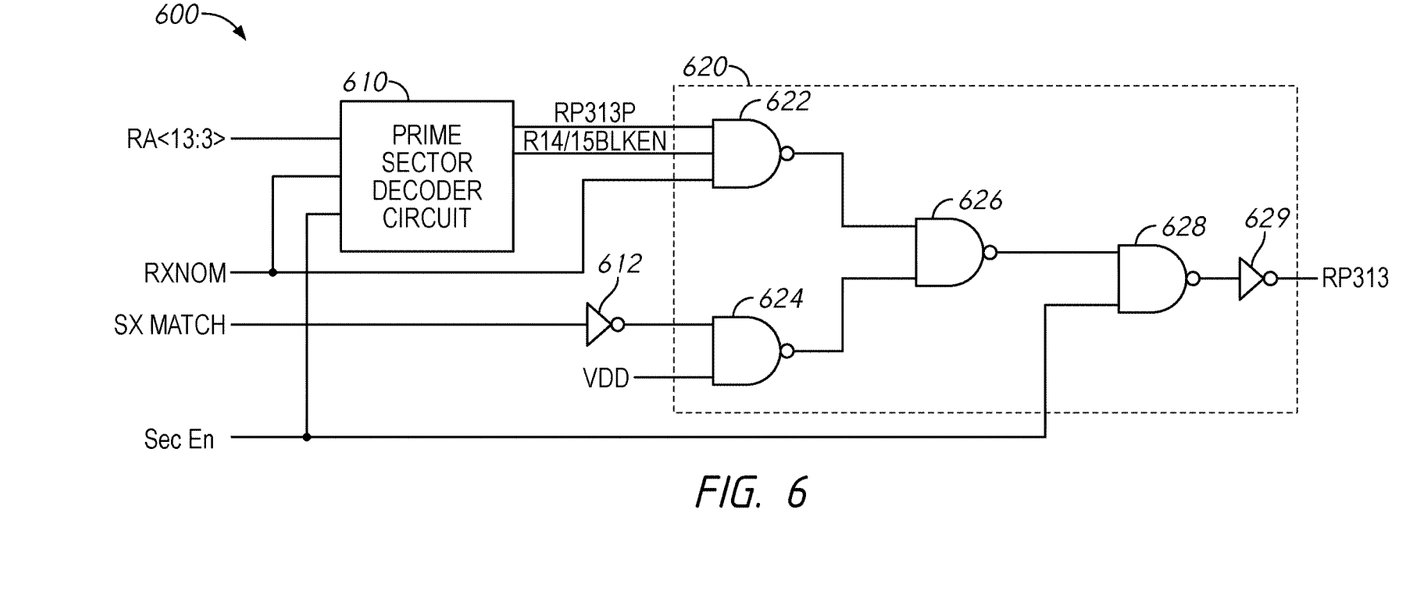
FIG. 6 is a block diagram of a portion of a predecoder circuit, in accordance with an embodiment of the present disclosure.

FIG. 6 is a block diagram of a portion of a predecoder circuit 600, in accordance with an embodiment of the present disclosure. The portion of the predecoder circuit 600 may include a prime section decoder circuit 610 coupled to a prime or redundancy section mux circuit 620. The portion of the predecoder circuit 600 may be configured to provide a row factor 313 signal RP313. In some examples, the row decoders 130 of FIG. 1 and/or the predecoders 230(0-(3) may each implement the portion of the predecoder circuit 600.

The prime section decoder circuit 610 may be configured to receive row address bits RA<13:3> and to provide a preliminary RP313 signal RF313P. The RP313P signal may indicate that the prime row is included in a subset of rows managed by the predecoder circuit 600.

The prime or redundancy section mux circuit 620 may be configured to receive the RP313P signal, along with the RF1415BLKEN signal (e.g., from the RF1415 decoder circuit 440 of FIG. 4) a Sx match signal (e.g., from the S0-S53 match signals of FIG. 2, and/or the S0-Sm match signals of FIGS. 3 and 5), and the SecEn signal. The prime or redundancy section mux circuit 620 may include a NAND gate 622, a NAND gate 624, a NAND gate 626, and a NAND gate 628. The NAND gate 622 may be configured to apply NAND logic to the RP313P, the R1415BLKE, and the RXNOM signals to provide an output signal to the NAND gate 626. Thus, the output of the NAND gate 622 is controlled by the RP313P and the RF1415BLKEN signals when no defective row hit is detected (e.g., RXNOM has a logical high value to indicate a miss). When the RXNOM signal indicates a hit (e.g., has a logical low value), the RP313P and the RF1415BLKEN signals are overridden. The NAND gate 624 may be configured to apply NAND logic to the Sx match signal and a high supply voltage signal to provide an output signal to the NAND gate 626.

The NAND gate 626 may be configured to apply NAND logic to the outputs of the NAND gate 622 and the NAND gate 624 to provide an output to the NAND gate 628. Thus, when the outputs of either or both of the NAND gate 622 (e.g., prime row detected with no defective row) and the NAND gate 624 (e.g., defective row detected) are low, the output of the NAND gate 626 may be forced high. Otherwise, the output of the NAND gate 626 may be set low. That is, the output of the NAND gate 626 may indicate whether the predecoder circuit 600 should start access operations on a prime row and/or a redundant row.

A combination of the NAND gate 628 and an inverter 629 may apply AND logic to the output of the NAND gate 626 and the SecEn signal to provide the RP313 signal. Thus, in response to the SecEn signal being set, the RP313 signal provided from the NAND gate 628 and the inverter 629 may reflect an output of the NAND gate 626 (e.g., whether the predecoder circuit 600 should start access operations on a prime row and/or a redundant row).

Figure 7:
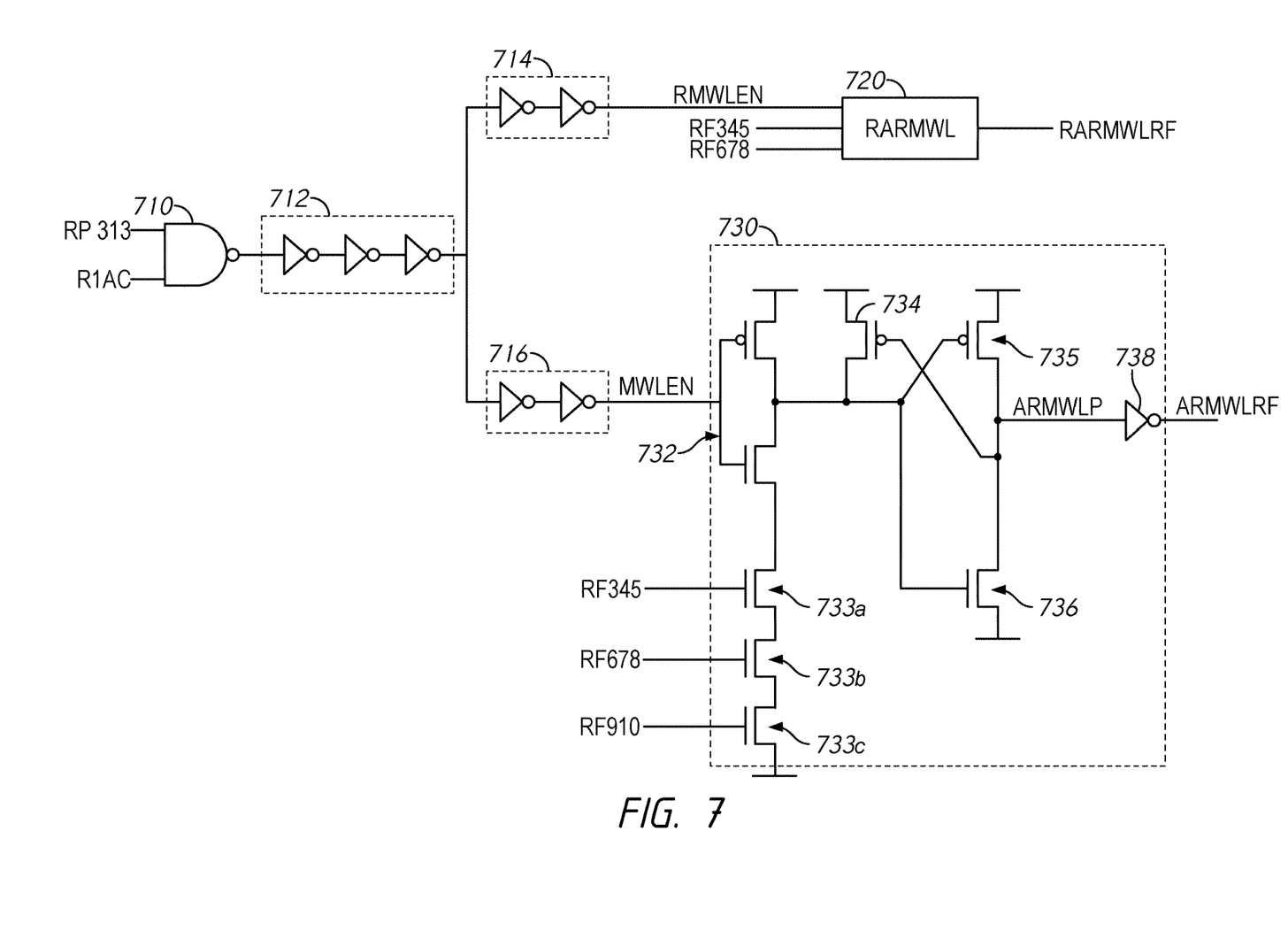
FIG. 7 is a schematic block diagram of a main wordline driver circuit, in accordance with an embodiment of the present disclosure.

FIG. 7 is a schematic block diagram of a main wordline driver circuit 700, in accordance with an embodiment of the present disclosure. The main wordline driver circuit 700 may include a preliminary activation stage (e.g., a NAND gate 710, a delay and inverter circuit 712, a delay/driver circuit 714 and a delay/driver circuit 716) coupled to a redundancy main wordline driver 720 and a prime main wordline driver 730. In some examples, the row decoders 130 of FIG. 1 and/or the main wordline drivers 260 of FIG. 2 may implement the main wordline driver circuit 700.

The NAND gate 710 may be configured to apply NAND logic to the RP313 signal (e.g., provided from the prime or redundancy section mux circuit 620 of FIG. 6) and the R1AC activation signal (e.g., from the bank control circuits 128 of FIG. 1) to provide an enable signals to the delay and inverter circuit 712. The delay and inverter circuit 712 may delay and invert the output of the NAND gate 710 to provide an output signal to the delay/driver circuit 714, which may provide a redundant main word line enable signal RMWLEN, and to the delay/driver circuit 716, which may provide a main word line enable signal MWLEN (via the delay and inverter circuit 712 and the delay/driver circuit 714).

The redundancy main wordline driver 720 may provide a redundant arm MWL signal RARMWLRF based on the RMWLEN signal, the RF345 signal (e.g., from the RF345 decoder circuit 410 of FIG. 1), the RF678 signal (e.g., from the RF678 decoder circuit 420 of FIG. 4)), and the RF910 signal (e.g., from the RF910 decoder circuit 430 of FIG. 4). The prime main wordline driver 730 may provide a prime arm MWL signal ARMWLRF based on the RMWLEN signal, the RF345 signal (e.g., from the RF345 decoder circuit 410 of FIG. 1), the RF678 signal (e.g., from the RF678 decoder circuit 420 of FIG. 4), the RF910 signal (e.g., from the RF910 decoder circuit 430 of FIG. 4). The redundancy main wordline driver 720 and the prime main wordline driver 730 may include the same circuitry. Thus, for clarity and conciseness, only the detailed circuitry of the prime main wordline driver 730 is depicted and described. It is appreciated that the circuitry of the redundancy main wordline driver 720 may be the same as depicted in the prime main wordline driver 730, and will operate in the same manner.

The prime main wordline driver 730 may include an inverter 732 configured to receive the MWLEN signal, with a pull down controlled by transistors 733a, 733b, and 733c. The transistors 733a, 733b, and 733c may be controlled by the RF345, RF678, and RF910 signals, respectively. Thus, for the prime section, when a defective row is detected, the RF313, RF678, and RF910 signals may prevent the output of the inverter 732 from pulling down. The prime main wordline driver 730 may further include an inverter formed by transistors 735 and 736 to receive the output of the inverter 732 and to provide an ARMWLP signal. The prime main wordline driver 730 may further include a transistor 734 having a gate coupled to the output of the inverter formed by the transistors 735 and 736, a drain coupled to the input of the inverter formed by the transistors 735 and 736, and a source coupled to a high voltage. When the output of the inverter formed by the transistors 735 and 736 transitions low, the transistor 734 may cause the output of the inverter formed by the transistors 735 and 736 to transition back high. The inverter 738 may be configured to invert the output of the output of the inverter formed by the transistors 735 and the 736 to provide the ARMWLRF signal.

Figure 8:
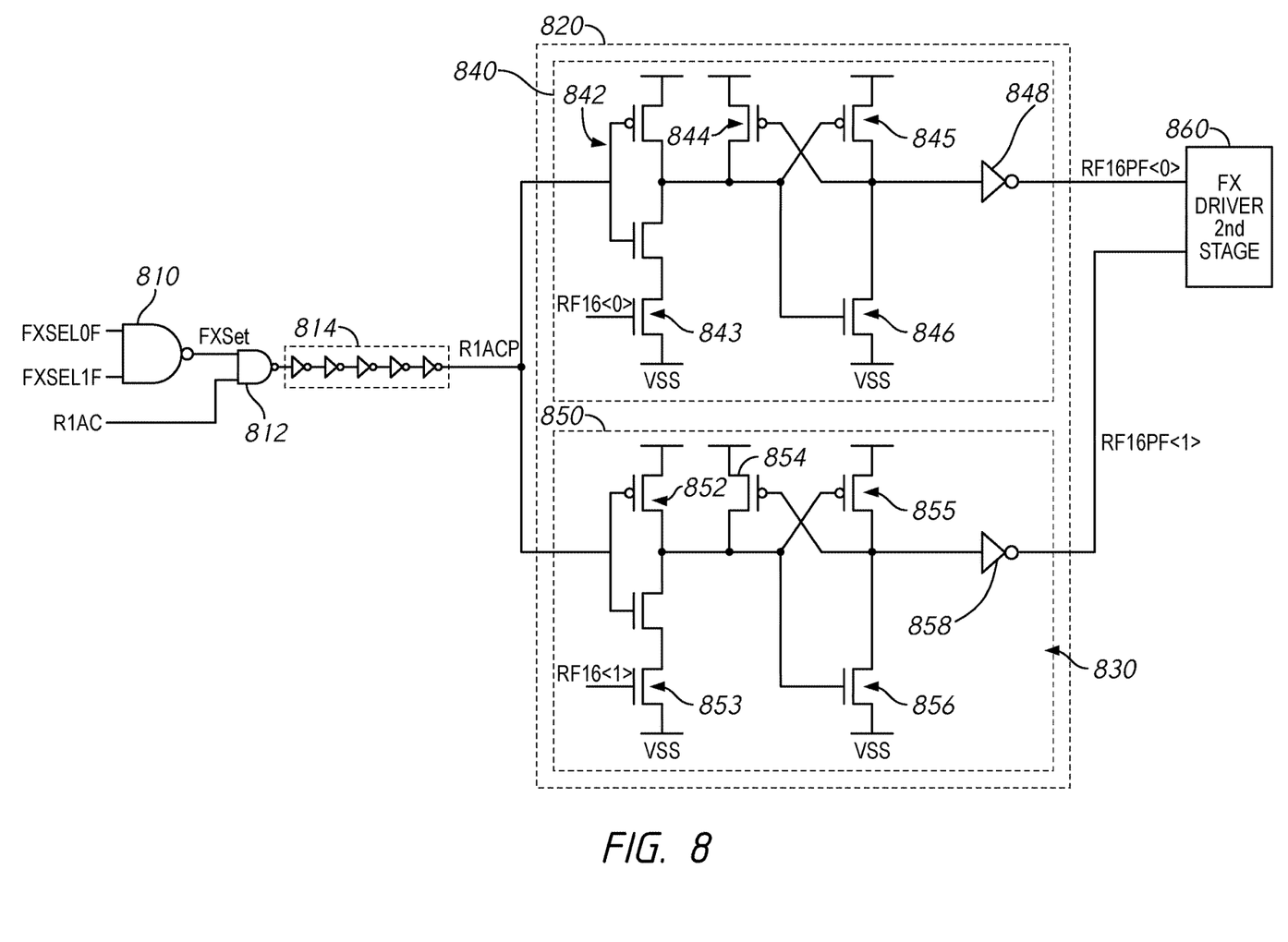
FIG. 8 is a schematic block diagram of an FX driver circuit, in accordance with an embodiment of the present disclosure.

FIG. 8 is a schematic block diagram of an FX driver circuit 800, in accordance with an embodiment of the present disclosure. The FX driver circuit 800 may include a preliminary activation stage (e.g., a NAND gate 810, a NAND gate 812, and an inverter/delay circuit 814), a FX driver first stage 820, and a FX driver second stage 860. The FX driver circuit 800 may be configured to control sub-wordline drivers and other circuitry to facilitate an access operation. In some examples, the row decoders 130 of FIG. 1 and/or the FX drivers 270 of FIG. 2 may implement the FX driver circuit 800.

The NAND gate 810 may be configured to apply NAND logic to active low FX select 0 and 1 signals FXSEL0F and FXSEL1F to provide an FXSet signal. The NAND gate 812 may be configured to the FXSet signal and the R1AC activation signal to provide an output to the inverter/delay circuit 814. The inverter/delay circuit 814 may be configured to delay and invert the output of the NAND gate 812 to provide an R1CP signal to the FX driver first stage 820.

The FX driver first stage 820 may include a first section 840 and a second section 850. The circuitry of the first section 840 and the second section 850 may be the same, with the difference being that the first section 840 is further controlled based on an RF16<0> signal and the second section 850 is further controlled based on an RF16<1> signal. The RF16<1:0> signals may be provided by predecoder row factor circuitry, such as the RF16 decoder circuit 450 of FIG. 4.

The first section 840 may include an inverter 842 configured to receive the R1ACP signal, with a pull down controlled by a transistor 843. The transistor 843 may be controlled by the RF16<0> signal. Thus, for the prime section, when a defective row is detected, the RF16<0> signal may prevent the output of the inverter 842 from pulling down. The first section 840 may further include an inverter formed by transistors 845 and 846 coupled in series with an inverter 848. The inverter formed by transistors 845 and 846 coupled in series with the inverter 848 may be to receive the output of the inverter 842 and to provide an RF16PF<0> signal. The first section 840 may further include a transistor 844 having a gate coupled to the output of the inverter formed by the transistors 845 and 846, a drain coupled to the input of the inverter formed by the transistors 845 and 846, and a source coupled to a high voltage. When the output of the inverter formed by the transistors 845 and 846 transitions low, the transistor 844 may cause the output of the inverter formed by the transistors 845 and 846 to transition back high.

The second section 850 may include an inverter 852 configured to receive the R1ACP signal, with a pull down controlled by a transistor 853. The transistor 853 may be controlled by the RF16<1> signal. Thus, for the prime section, when a defective row is detected, the RF16<1> signal may prevent the output of the inverter 852 from pulling down. The second section 850 may further include an inverter formed by transistors 855 and 856 coupled in series with an inverter 858. The inverter formed by the transistors 855 and 856 coupled in series with the inverter 858 may be to receive the output of the inverter 852 and to provide an RF16PF<1> signal. The second section 850 may further include a transistor 854 having a gate coupled to the output of the inverter formed by the transistors 855 and 856, a drain coupled to the input of the inverter formed by the transistors 855 and 856, and a source coupled to a high voltage. When the output of the inverter formed by the transistors 855 and 856 transitions low, the transistor 854 may cause the output of the inverter formed by the transistors 855 and 856 to transition back high.

In response to the RF16PF<1:0> signals, the FX driver second stage 860 may drive control signals to facilitate an access operation in a memory array.

Figure 9:
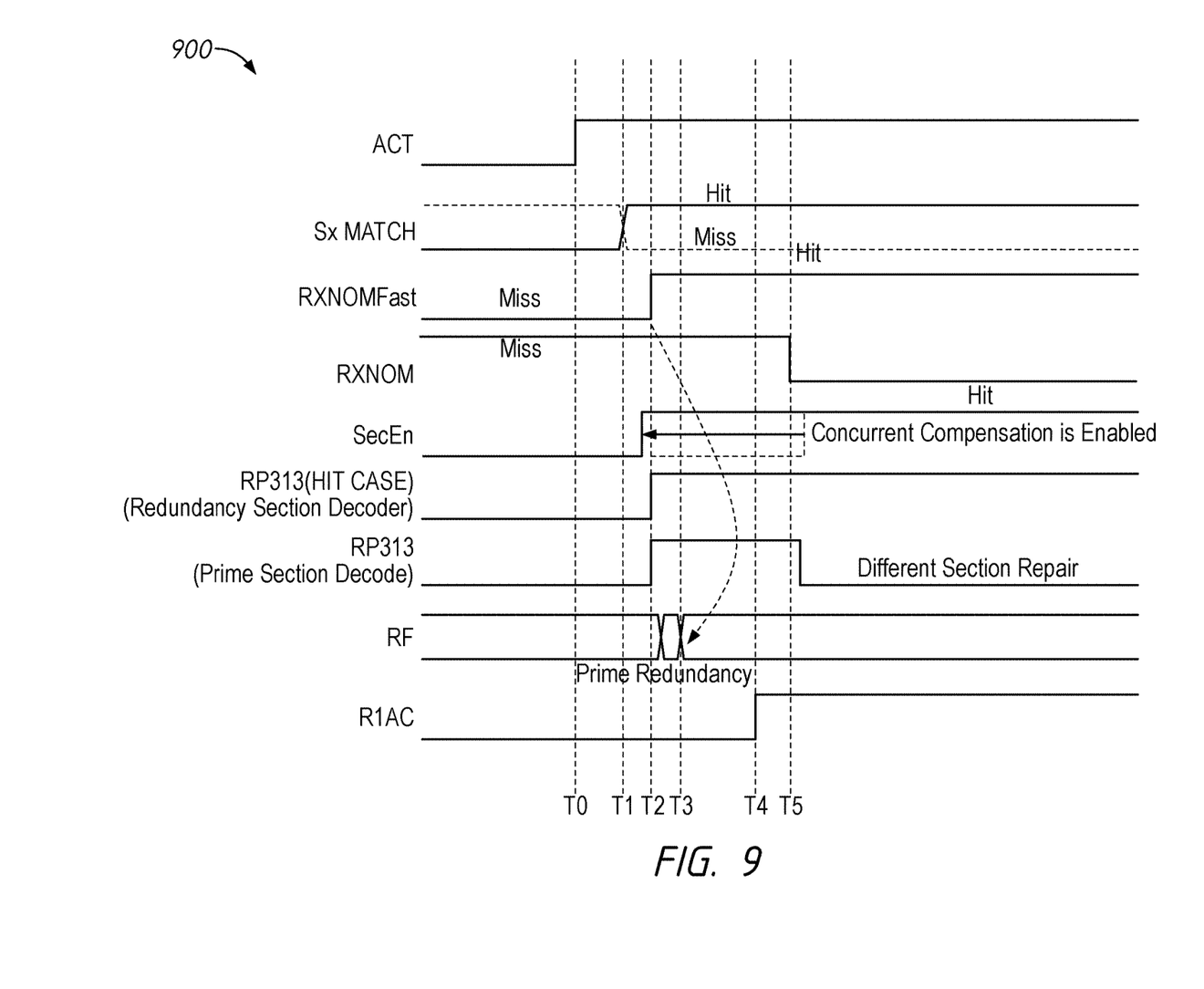
FIG. 9 is an illustrations of an exemplary timing diagrams depicting a hit-case concurrent compensation operation in accordance with embodiments of the present disclosure.

FIG. 9 is an illustrations of an exemplary timing diagrams 900 depicting a hit-case concurrent compensation operation in accordance with embodiments of the present disclosure. The timing diagram 900 may primarily illustrate operation of bank logic control circuitry (e.g., the 128 of FIG. 1) and row decoder circuitry (e.g., the row decoders 130 of FIG. 1, the semiconductor device 200 of FIG. 2, the the fuse latch circuits and match comparators between fuse addresses and row addresses 300 of FIG. 3, the predecoder circuit 400 of FIG. 4, the RXNOM tree 500 of FIG. 5, the predecoder circuit 600 of FIG. 6, or any combination thereof. The Sx match signal may correspond to any of the S0-S52 match signals of FIG. 2, any of the S0-Sm match signals of FIG. 3, or the Sx match signal of FIG. 6. The RXNOMFast signal may correspond to any of the RXNOMFast signals of FIG.

2 or the RXNOMFast signal of FIG. 4. The RXNOM signal may correspond to the RXNOM signal of any of FIGS. 2, 4, 5, and 6. The redundancy and prime RP313 signals may correspond to the RP313 signals of any of FIG. 6 or 7. The RF signal may correspond to the RF0-3 signals of FIG. 2, the RF345 and/or RF678 signals of any of FIG. 4 or 7, the RF1415BLKEN signal of FIGS. 4 and 6, the RF16<1:0> of any of FIG. 4 or 8, or any combination thereof. The R1AC signal may correspond to the R1AC signal of any of FIG. 4, 7, or 8.

Prior to time T0, an access command may be received. A time T0, in response to the access command, an activation command signal ACT may transition high to start an access operation. In response to the access command, fuse latches (e.g., the fuse latches and comparators 214(0)-(52) of FIG. 2 and/or the the fuse latch circuits and match comparators between fuse addresses and row addresses 300 of FIG. 3) may start comparing a prime row address with latched defective row addresses stored at the fuse latches.

At time T1, the Sx Match signal may transition high indicating a match between a defective address and the prime row address. Just before time T2, the SecEn signal may transition high. In response, at time T2, a compensation operation on the prime row may start, including setting of the prime section row factor signals RF between times T3 and T4.

Also at time T2, in response to the SecEn signal and the hit indication on the Sx match signal, a compensation operation may be initiated on the redundant row. Also at time T3, the RXNOMFast signal may be transition from a miss indication to a hit indication based on the SxMatch signal. In response to transition of the RXNOMFast signal indicating a hit, some of the RF signals may transition to reflect the hit indication and some of the prime row RF signals may be reset to prevent activation of prime row wordline when the redundant row is in a different row section (e.g., another of the row sections 0-53 of FIG. 2). If the prime and redundancy rows are in the same row section, then there would only be one of the RP313 signals for both the prime and redundancy rows, and it would remain high.

At time T4, the R1 AC signal may transition to initiate activation of a wordline based on the RF signals. At time T5, the RFNOM may transition from a miss indication to a hit indication based on the Sx match and RXNOMFast signals. In response, the prime section RP313 signal may transition low when the prime section is different than the redundancy section.

The timing diagram 900 is exemplary for illustrating operation of various described embodiments. Although the timing diagram 900 depicts a particular arrangement of signal transitions of the included signals, one of skill in the art will appreciate that additional or different transitions may be included in different scenarios without departing from the scope of the disclosure. Further, the depiction of a magnitude of the signals represented in the timing diagram 900 is not intended to be to scale, and the representative timing is an illustrative example of a timing characteristics.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
  a first plurality of defective row address comparison circuits each associated with a respective row section of a first plurality of row sections of a memory array and configured to store a respective defective prime row address, wherein each of the first plurality of defective row address comparison circuits are configured to compare a received prime row address with the stored respective defective prime row address to provide a respective match signal;
  a second plurality of defective row address comparison circuits each associated with a respective row section of a second plurality of row sections of the memory array and configured to compare the received prime row address with a respective defective prime row address to provide a respective match signal;
  a logic tree configured to compare the respective hit signals from the first plurality of row address comparison circuits to provide a first fast hit signal and to compare the respective hit signals from the second plurality of row address comparison circuits to provide a second fast hit signal, wherein the logic tree is further configured to compare the first and second fast hit signals to provide a hit signal;
  a row decoder comprising a first predecoder associated with the first plurality of row sections and a second predecoder associated with the second plurality of row sections, wherein, during an access operation:
  the first predecoder is configured to cause a first threshold voltage compensation operation to be initiated on a respective redundant row of a first row section of the first plurality of row sections associated with the respective hit signal provided by one of the first plurality of defective row address comparison circuits in response to the respective hit signal indicating that a prime row address matches the respective defective prime row address; and
  the second predecoder is configured to, concurrent with the first threshold voltage compensation operation, cause a second threshold voltage compensation operation to be initiated on a prime row of a second row section of the second plurality of row sections when the prime row of the second row section of the second plurality of row sections corresponds to the prime row address, wherein the second predecoder is further configured to prevent an access operation associated with the prime row from proceeding in response to the first fast hit signal.

2. The apparatus of claim 1, further comprising a first and second pluralities of defective row address latch circuits each associated with a respective row section of the first and second pluralities of row sections, respectively, and configured to latch the respective defective prime row address.

3. The apparatus of claim 1, wherein the second predecoder is configured to stop the access operation associated with the prime row in response to the hit signal.

4. The apparatus of claim 3, wherein the logic tree causes the first fast hit signal to indicate a hit before the hit signal.

5. The apparatus of claim 1, wherein the second predecoder is configured to prevent activation of a word line coupled to the prime row in response to the first fast hit signal.

6. The apparatus of claim 1, further comprising a main wordline driver configured to receive a signal from the second predecoder to control activation of a main wordline coupled to the wordline.

7. The apparatus of claim 1, further comprising a sub-wordline driver circuit configured to receive a signal from the second predecoder to control activation of the wordline.

8. The apparatus of claim 1, wherein the second predecoder is configured to cause the first threshold voltage compensation operation to be initiated on a respective redundant row of a third row section of the second plurality of row sections associated with the respective hit signal provided by one of the second plurality of defective row address comparison circuits in response to the respective hit signal indicating that the prime row address matches the respective defective prime row address.

9. The apparatus of claim 1, wherein, during the access operation, the first predecoder is configured to prevent the first threshold voltage compensation operation from being initiated on any respective redundant row of any of the first plurality of row sections in response to the respective hit signals of each of the first plurality of defective row address comparison circuits indicating a miss.

10. The apparatus of claim 1, wherein, during the access operation, the first predecoder is configured to cause the second threshold voltage compensation operation to be initiated on a prime row of a third row section of the first plurality of row sections when the prime row of the third row section of the first plurality of row sections corresponds to the prime row address.

11. An apparatus comprising:
a first plurality of fuse latch and comparator circuits each associated with a particular row section of a first plurality of row sections and configured to store a respective defective row address, wherein individual ones of the first plurality of fuse latch and comparator circuits are each configured to, in response to a determination that a received prime row address matches the respective defective row address, provide a respective match signal;
a second plurality of fuse latch and comparator circuits each associated with a particular row section of a second plurality of row sections and configured to store a respective defective row address, wherein individual ones of the second plurality of fuse latch and comparator circuits are each configured to, in response to a determination that a received prime row address matches the respective defective row address, provide a respective match signal;
a logic tree configured to compare the respective match signals from the first of fuse latch and comparator circuits to provide a first fast hit signal and to compare the respective hit signals from the second plurality of fuse latch and comparator circuits to provide a second fast hit signal, wherein the logic tree is further configured to compare the first and second fast hit signals to provide a hit signal;
a first predecoder coupled to the first plurality of fuse latch and comparator circuits to receive the respective match signal and to receive the prime row address, wherein, in response to one of the respective match signal, cause a first threshold voltage compensation to be initiated on a first redundant row associated with the first fuse latch and comparator circuit, wherein, in response to a determination that the decoded prime row address targets a first prime row of the first plurality of row sections, cause a second threshold voltage compensation operation to be initiated on the first prime row, wherein, in response to the first or second fast hit signals being set, the first predecoder is configured to prevent an access operation associated with the first prime row from proceeding; and
a second predecoder coupled to the second plurality of fuse latch and comparator circuits and configured to receive the second match signal and to receive the prime row address, wherein, in response to the first match signal, cause a third threshold voltage compensation to be initiated on a second redundant row associated with the second fuse latch and comparator circuit, wherein, in response to a determination that the decoded prime row address targets a second prime row of the second plurality of row sections, cause a fourth threshold voltage compensation operation to be initiated on the second prime row, wherein at least one of the first or third threshold voltage compensation operations is at least partially concurrent with at least one of the second or fourth threshold voltage compensation operations, wherein, in response to the first or second fast hit signals being set, the second predecoder is configured to prevent an access operation associated with the second prime row from proceeding.

12. The apparatus of claim 11, further comprising a memory array mat including the first and second pluralities of row sections.

13. The apparatus of claim 11, wherein, in response to the hit signal, the first predecoder is configured to stop the second concurrent threshold voltage compensation operation on the first prime row, wherein, in response to the hit signal, the second predecoder is configured to stop the second concurrent threshold voltage compensation operation on the second prime row.

14. The apparatus of claim 11, wherein the hit signal provided by the logic tree is delayed relative to the first and second fast hit signals.

15. The apparatus of claim 11, wherein the first plurality of fuse latch and comparator circuits each includes respective fuse latches configured to store the respective detective prime address received from a fuse array.

16. The apparatus of claim 15, wherein the first predecoder is configured to skip initiation of the first threshold voltage compensation operation when the first match signal provided from the first fuse latch and comparator circuit indicates that the prime row address is different than the respective defective row address.

17. A method comprising:
receiving a prime row address associated with an access operation at a first plurality of fuse latch comparator circuits, a second plurality of fuse latch comparator circuits, a first predecoder, and a second predecoder, wherein each of the first plurality of fuse latch and comparator circuits is associated with a particular row section of a first plurality of row sections and each of the second plurality of fuse latch and comparator circuits is associated with a particular row section of a second plurality of row sections;
providing, via the first plurality of fuse latch comparator circuits, respective first respective match signals in response to a determination that the prime row address matches a respective defective row address;

providing, via the second plurality of fuse latch comparator circuits, respective second match signals in response to a determination that the prime row address matches a respective defective row address;

comparing the respective match signals provided from the first plurality of fuse latch comparator circuits to provide a first fast hit signal;

comparing the respective match signals provided from the second plurality of fuse latch comparator circuits to provide a second fast hit signal;

comparing the first and second fast hit signals to provide a hit signal; and concurrently:

in response to one of the respective match signals provided from the first plurality of fuse latch comparator circuits, causing, via the first predecoder, a first threshold voltage compensation to be initiated on a first redundant row associated with one of the first plurality of fuse latch comparator circuits; and in response to a determination that the prime row address targets a first prime row of the second plurality of row sections, causing, via the second predecoder, a second threshold voltage compensation operation to be initiated on the first prime row; and in response to the first or second fast hit signals, preventing an access operation associated with the first prime row from proceeding.

18. The method of claim 17, further comprising, in response to the hit signal, stopping the second concurrent threshold voltage compensation operation on the first prime row.

19. The method of claim 18, wherein the hit signal is delayed relative to the first and second fast hit signals.

20. The method of claim 17, further comprising comparing the respective match signals provided from the first plurality of fuse latch comparator circuits using XOR gates to provide the first fast hit signal.

21. The method of claim 17, further comprising, concurrently:

in response to one of the respective match signals provided from the second plurality of fuse latch comparator circuits, causing, via the second predecoder, a third threshold voltage compensation to be initiated on a second redundant row associated with one of the second plurality of fuse latch comparator circuits; and in response to a determination that the prime row address targets a second prime row of the first plurality of row sections, causing, via the first predecoder, a fourth threshold voltage compensation operation to be initiated on the second prime row.

* * * * *